United States Patent
Doi et al.

(10) Patent No.: US 11,889,761 B2
(45) Date of Patent: Jan. 30, 2024

(54) THERMOELECTRIC CONVERSION MODULE MEMBER, THERMOELECTRIC CONVERSION MODULE, AND METHOD FOR MANUFACTURING THERMOELECTRIC CONVERSION MODULE MEMBER

(71) Applicant: Sumitomo Chemical Company, Limited, Tokyo (JP)

(72) Inventors: Atsunori Doi, Tsukuba (JP); Satoshi Shimano, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 9 days.

(21) Appl. No.: 16/959,514

(22) PCT Filed: Feb. 19, 2019

(86) PCT No.: PCT/JP2019/005974
§ 371 (c)(1),
(2) Date: Jul. 1, 2020

(87) PCT Pub. No.: WO2019/167709
PCT Pub. Date: Sep. 6, 2019

(65) Prior Publication Data
US 2021/0367130 A1 Nov. 25, 2021

(30) Foreign Application Priority Data
Feb. 27, 2018 (JP) .................................. 2018-032925

(51) Int. Cl.
*H10N 10/17* (2023.01)
*H10N 10/01* (2023.01)
(Continued)

(52) U.S. Cl.
CPC ............. *H10N 10/17* (2023.02); *H10N 10/01* (2023.02); *H10N 10/852* (2023.02); *H10N 10/855* (2023.02)

(58) Field of Classification Search
CPC ......... H01L 35/32; H01L 35/16; H01L 35/22; H01L 35/34
See application file for complete search history.

(56) References Cited

U.S. PATENT DOCUMENTS 3,744,560 A * 7/1973 Sell, Jr. ................... H01L 35/06
165/185
3,859,143 A * 1/1975 Krebs ...................... H01L 35/16
136/205
(Continued)

FOREIGN PATENT DOCUMENTS

| JP | H10-074986 A | 3/1998 |
| WO | 2017/170911 A1 | 10/2017 |
| WO | 2017/170914 A1 | 10/2017 |

OTHER PUBLICATIONS

Yu, et al., Scientific Reports, 2017, vol. 7, 45177 (Year: 2017).*
(Continued)

*Primary Examiner* — Sadie White
(74) *Attorney, Agent, or Firm* — Morgan, Lewis & Bockius LLP

(57) ABSTRACT

To provide a thermoelectric conversion module member which has a high connecting property between a thermoelectric conversion layer and a diffusion prevention layer and is also excellent in heat resistance.

A thermoelectric conversion module member comprising a thermoelectric conversion layer and a diffusion prevention layer in contact with the above-described thermoelectric conversion layer, wherein the above-described thermoelectric conversion layer is a layer containing a thermoelectric conversion material having a silicon element or a tellurium
(Continued)

element, the above-described diffusion prevention layer is a layer containing a metal and the same thermoelectric conversion material as that contained in the above-described thermoelectric conversion layer, and the amount of the above-described thermoelectric conversion material in the above-described diffusion prevention layer is 10 to 50 parts by weight with respect to 100 parts by weight of the above-described metal.

20 Claims, 3 Drawing Sheets

(51) Int. Cl.
  *H10N 10/852* (2023.01)
  *H10N 10/855* (2023.01)

(56) References Cited

U.S. PATENT DOCUMENTS

| | | | | |
|---|---|---|---|---|
| 5,665,176 | A * | 9/1997 | Shinohara | H01L 35/22 252/62.3 R |
| 2001/0032982 | A1* | 10/2001 | Yamaguchi | H01L 31/032 257/E31.026 |
| 2002/0014261 | A1* | 2/2002 | Caillat | H01L 35/04 136/205 |
| 2002/0024154 | A1* | 2/2002 | Hara | H01L 23/38 257/712 |
| 2004/0177876 | A1* | 9/2004 | Hightower | H01L 35/32 136/211 |
| 2006/0118159 | A1 | 6/2006 | Tsuneoka et al. | |
| 2010/0170552 | A1* | 7/2010 | Murai | H01L 35/34 136/201 |
| 2011/0073797 | A1* | 3/2011 | Kanatzidis | C01B 19/007 252/71 |
| 2011/0220164 | A1* | 9/2011 | Guha | H01L 35/34 438/54 |
| 2012/0001356 | A1* | 1/2012 | Chang | B82Y 30/00 977/773 |
| 2012/0103381 | A1* | 5/2012 | Leavitt | H01L 35/34 136/238 |
| 2013/0146116 | A1 | 6/2013 | Jovovic et al. | |
| 2013/0153811 | A1* | 6/2013 | Ikeda | C04B 35/645 252/62.3 T |
| 2013/0186449 | A1* | 7/2013 | Venkatasubramanian | H01F 1/401 136/238 |
| 2013/0213447 | A1* | 8/2013 | Hayashi | H01L 35/34 438/54 |
| 2014/0014154 | A1* | 1/2014 | Hayashi | H01L 35/32 136/205 |
| 2014/0096809 | A1* | 4/2014 | Kim | H01L 35/16 136/238 |
| 2014/0299170 | A1* | 10/2014 | Simonin | B23K 35/286 228/179.1 |
| 2015/0214461 | A1* | 7/2015 | Kurihara | H01L 35/34 257/467 |
| 2015/0219574 | A1* | 8/2015 | Yao | H01L 35/32 374/31 |
| 2016/0163950 | A1* | 6/2016 | Liao | H01L 35/08 136/201 |
| 2018/0076372 | A1* | 3/2018 | Ren | C01B 19/002 |
| 2019/0109269 | A1 | 4/2019 | Shimano et al. | |
| 2019/0115517 | A1 | 4/2019 | Shimano et al. | |

OTHER PUBLICATIONS

Petrova, et al., Inorganic Materials, 2004, vol. 40, No. 6, pp. 558-562 (Year: 2004).*
Miyazaki, et al., Physical Review B, 2008, vol. 78, 214104 (Year: 2008).*
Lan, et al., Applied Physics Letters, 2008, vol. 92, 101910 (Year: 2008).*
Cai, et al., Journal of Physics D: Applied Physics, 2014, vol. 47, 115101 (Year: 2014).*
Kim, et al., Physical Review B, 2016, vol. 93, 075119 (Year: 2016).*
Sterzi, et al., Journal of Electron Spectroscopy and Related Phenomena, 2018, vol. 225, pp. 23-27 (Year: 2018).*
Kuznetsov, et al., Journal of Applied Physics, 1999, vol. 85, 3207-3210 (Year: 1999).*
Kanazawa, et al., Applied Physics Letters, 2012, vol. 100, 093902 (Year: 2012).*

* cited by examiner

[Fig. 1]
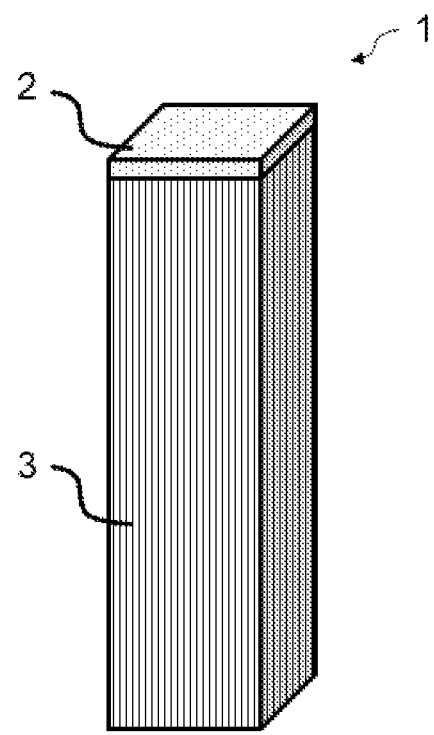

[Fig. 2]
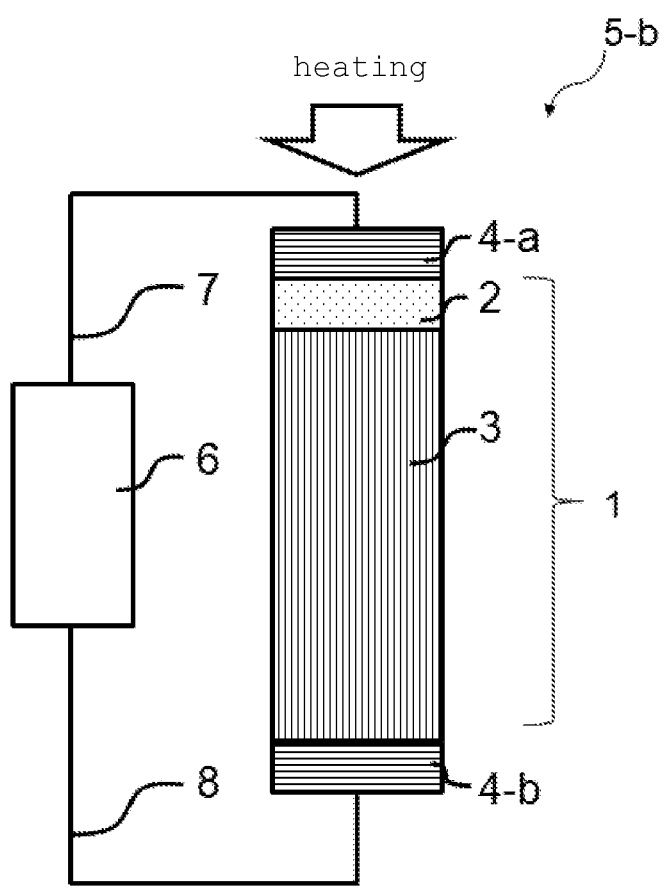

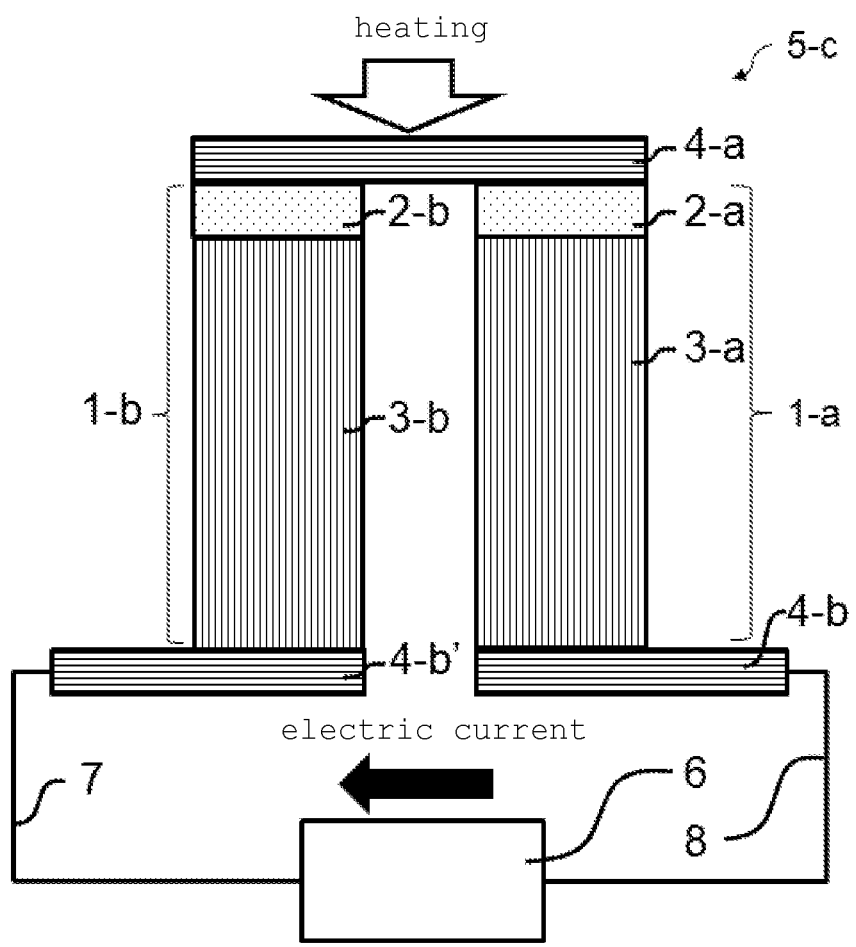
[Fig. 3]

THERMOELECTRIC CONVERSION MODULE MEMBER, THERMOELECTRIC CONVERSION MODULE, AND METHOD FOR MANUFACTURING THERMOELECTRIC CONVERSION MODULE MEMBER

TECHNICAL FIELD

The present invention relates to a thermoelectric conversion module member, a thermoelectric conversion module, and a method for producing a thermoelectric conversion module member.

BACKGROUND ART

As a module for effectively utilizing thermal energy, a thermoelectric conversion module is known of converting heat into electric power by utilizing the Seebeck effect in which electromotive force is generated in response to a temperature difference when a pair of electrodes are formed and one of the electrodes is maintained at a high temperature and the other at a low temperature to create a temperature difference.

Generally, a thermoelectric conversion module has a pair of electrodes and a thermoelectric conversion layer provided between the electrodes, and is used under a high temperature environment. Therefore, mutual substance diffusion between the thermoelectric conversion layer and the electrode and heat resistance become problems. In order to solve such problems, introduction of a diffusion prevention layer is being studied.

For example, Patent Document 1 discloses a thermoelectric conversion module having an electrode layer, a thermoelectric conversion layer, and a diffusion prevention layer containing only a metal such as Ni.

PRIOR ART DOCUMENT

Patent Document

[Patent Document 1] Japanese Unexamined Patent Application Publication (JP-A) No. 10-74986

SUMMARY OF THE INVENTION

Problem to be Solved by the Invention

However, the thermoelectric conversion module described in Patent Document 1 is not sufficient in a connecting property between the thermoelectric conversion layer and the diffusion prevention layer and heat resistance.

Therefore, an object of the present invention is to provide a thermoelectric conversion module member which has a high connecting property between the thermoelectric conversion layer and the diffusion prevention layer and is also excellent in heat resistance.

Means for Solving the Problem

That is, the present invention provides the following [1] to [5].

[1] A thermoelectric conversion module member comprising a thermoelectric conversion layer and a diffusion prevention layer in contact with the above-described thermoelectric conversion layer, wherein the above-described thermoelectric conversion layer is a layer containing a thermoelectric conversion material having a silicon element or a tellurium element, the above-described diffusion prevention layer is a layer containing a metal and the same thermoelectric conversion material as the thermoelectric conversion material contained in the above-described thermoelectric conversion layer, and the amount of the above-described thermoelectric conversion material in the above-described diffusion prevention layer is 10 to 50 parts by weight with respect to 100 parts by weight of the above-described metal.

[2] The thermoelectric conversion module member according to [1], wherein the above-described thermoelectric conversion material is at least one material selected from the group consisting of a material whose main phase is $Bi_2Te_{3-x}Se_x$ ($0<x<3$) having a crystal structure belonging to the space group R-3m, a material whose main phase is $Bi_{2-y}Sb_yTe_3$ ($0 \leq y \leq 2$) having a crystal structure belonging to the space group R-3m, a material whose main phase is GeTe having a crystal structure belonging to the space group R3m, a material whose main phase is $GeBi_2Te_4$ having a crystal structure belonging to the space group R-3m, a material whose main phase is $GeBi_4Te_7$ having a crystal structure belonging to the space group P-3m1, a material whose main phase is SnTe having a crystal structure belonging to the space group Fm-3m, a material whose main phase is PbTe having a crystal structure belonging to the space group Fm-3m, a material whose main phase is $Mg_2Si_{1-z}Sn_z$ ($0 \leq z < 1$) having a $CaF_2$ type crystal structure, a material whose main phase is $FeSi_2$ having a crystal structure belonging to the space group Cmca, a material whose main phase is $MnSi_y$ ($1.7 \leq y \leq 1.8$) having a chimney-ladder type crystal structure, and a material whose main phase is CoSi having a B20 type crystal structure, at 25° C.

[3] A thermoelectric conversion module comprising a pair of electrodes and the thermoelectric conversion module member according to [1] or [2] provided between the above-described pair of electrodes.

[4] A method for producing a thermoelectric conversion module member having a thermoelectric conversion layer and a diffusion prevention layer in contact with the above-described thermoelectric conversion layer, comprising a first step of disposing one of the following material (1) and the following material (2) or a sintered body thereof in a molding die, to form a first layer;

a second step of disposing the other of the above-described material (1) and the above-described material (2) or a sintered body thereof in the above-described molding die so as to be in contact with the first layer formed in the above-described first step, to form a second layer thereby obtaining a stacking layer structure and a sintering step of sintering the stacking layer structure obtained in the second step, to obtain the thermoelectric conversion module member:

Material (1): a thermoelectric conversion material containing a silicon element or a tellurium element Material (2): a composition containing a metal and the same thermoelectric conversion material as the above-described material (1) at a proportion of 10 to 50 parts by weight of the above-described thermoelectric conversion material with respect to 100 parts by weight of the above-described metal.

[5] The production method according to [4], wherein the above-described second step further includes disposing the same material as the above-described first layer or a sintered body thereof, among the above-described material (1) and the above-described material (2), on the opposite side of the above-described first layer so as to be in contact with the above-described second layer, to form a third layer thereby obtaining a stacking layer structure.

Effect of the Invention

According to the present invention, it is possible to provide a thermoelectric conversion module member having a high connecting property between a thermoelectric conversion material layer and a diffusion prevention layer and excellent also in heat resistance.

BRIEF EXPLANATION OF DRAWINGS

FIG. 1 is a view showing the structure of a thermoelectric conversion module member (a) which is an embodiment of the present invention.

FIG. 2 is a schematic cross-sectional view showing the structure of a thermoelectric conversion module which is an embodiment of the present invention.

FIG. 3 is a schematic cross-sectional view showing the structure of a thermoelectric conversion module which is an embodiment of the present invention.

Next, embodiments of the present invention will be described in more detail. It should be noted that each of the drawings referred to illustrates merely schematically the shape, size, and arrangement of the components to the extent that the invention can be understood. The present invention is not limited to the following description, and each constituent element can be appropriately changed without departing from the gist of the present invention. Further, the configuration according to the embodiment of the present invention is not necessarily produced or used in the arrangement shown in the drawings.

MODES FOR CARRYING OUT THE INVENTION

In the present specification, the parameters of the thermoelectric conversion material contained in the thermoelectric conversion layer are represented by the following formulae (1) and (2).

The maximum thermal efficiency $\eta_{opt}$ of the thermoelectric conversion material is represented by the following formula (1). In the following formula (1), $T_H$ is the temperature at the high temperature end [unit: K], $T_C$ is the temperature at the low temperature end [unit: K], $T_{ave}$ is the average of $T_H$ and $T_c$ [unit: K], and Z is the average [unit: 1/K] of the thermoelectric conversion performance index z of the thermoelectric conversion material in the temperature range used.

[Mathematical Formula 1]

$$\eta_{opt} = \frac{T_H - T_C}{T_H} \frac{\sqrt{1 + ZT_{ave}} - 1}{\sqrt{1 + ZT_{ave}} + \frac{T_C}{T_H}} \quad (1)$$

The thermoelectric conversion performance index z [unit: 1/K] of the thermoelectric conversion material at a certain temperature T [unit: K] is represented by the following formula (2). The formula includes the Seebeck coefficient $\alpha$ [unit: V/K], the resistivity $\rho$ [unit: $\Omega \cdot m$] and the thermal conductivity $\kappa$ [unit: W/(m·K)] at a certain temperature T.

[Mathematical Formula 2]

$$zT = \frac{\alpha^2}{\rho \kappa} T \quad (2)$$

The larger the physical property value zT of the thermoelectric conversion material, the higher the maximum thermal efficiency $\eta_{opt}$ obtained by thermoelectric conversion. In order to improve the thermal efficiency, it is desired that a high thermoelectric conversion performance index z be obtained in a wide temperature range.

<Thermoelectric Conversion Module Member>

The thermoelectric conversion module member of the present invention is a thermoelectric conversion module member having a thermoelectric conversion layer and a diffusion prevention layer in contact with the thermoelectric conversion layer. The thermoelectric conversion module member may have two or more layers of the thermoelectric conversion layer or the diffusion preventing layer.

<Thermoelectric Conversion Layer>

The thermoelectric conversion layer provided in the thermoelectric conversion module member of the present invention is a layer containing a thermoelectric conversion material having a silicon element or a tellurium element.

The above-described thermoelectric conversion material is preferably at least one material selected from the group consisting of a material whose main phase is $Bi_2Te_{3-x}Se_x$ (0<x<3) having a crystal structure belonging to the space group R-3m, a material whose main phase is $Bi_{2-y}Sb_yTe_3$ (0≤y≤2) having a crystal structure belonging to the space group R-3m, a material whose main phase is GeTe having a crystal structure belonging to the space group R3m, a material whose main phase is $GeBi_2Te_4$ having a crystal structure belonging to the space group R-3m, a material whose main phase is $GeBi_4Te_7$ having a crystal structure belonging to the space group P-3m1, a material whose main phase is SnTe having a crystal structure belonging to the space group Fm-3m, a material whose main phase is PbTe having a crystal structure belonging to the space group Fm-3m, a material whose main phase is $Mg_2Si_{1-z}Sn_z$ (0≤z<1) having a $CaF_2$ type crystal structure, a material whose main phase is $FeSi_2$ having a crystal structure belonging to the space group Cmca, a material whose main phase is $MnSi_y$ (1.7≤y≤1.8) having a chimney-ladder type crystal structure, and a material whose main phase is CoSi having a B20 type crystal structure, at 25° C.

The above-described thermoelectric conversion material is a semiconductor. The thermoelectric conversion material whose carrier is an electron is called an n-type thermoelectric conversion material, and the thermoelectric conversion material whose carrier is a hole is called a p-type thermoelectric conversion material. The above-described thermoelectric conversion material may contain an element (referred to as a dopant element in the present specification in some cases) that increases the carrier density of electrons or holes in the thermoelectric conversion material, and can be an n-type thermoelectric conversion material or a p-type thermoelectric conversion material depending on the kind of the dopant element contained in the thermoelectric conversion material.

The dopant element contained in the n-type thermoelectric conversion material includes I, and the dopant element contained in the p-type thermoelectric conversion material includes Na.

The n-type thermoelectric conversion material includes the material whose main phase is $Bi_2Te_{3-x}Se_x$ ($0<x<3$) having a crystal structure belonging to the space group R-3m.

The p-type thermoelectric conversion material whose carrier is a hole includes the above-described material whose main phase is $Bi_{2-y}Sb_yTe_3$ ($0\leq y\leq 2$) having a crystal structure belonging to the space group R-3m and the above-described material whose main phase is $MnSi_\gamma$ ($1.7\leq\gamma\leq 1.8$) having a chimney-ladder type crystal structure.

The thermoelectric conversion material that can be an n-type thermoelectric conversion material or a p-type thermoelectric conversion material depending on the kind of the dopant element contained in the thermoelectric conversion material includes the material whose main phase is GeTe having a crystal structure belonging to the space group R3m, the material whose main phase is $GeBi_2Te_4$ having a crystal structure belonging to the space group R-3m, the material whose main phase is $GeBi_4Te_7$ having a crystal structure belonging to the space group P-3m1, the material whose main phase is SnTe having a crystal structure belonging to the space group Fm-3m, a material whose main phase is PbTe having a crystal structure belonging to the space group Fm-3m, the material whose main phase is $Mg_2Si_{1-z}Sn_z$ ($0\leq z<1$) having a $CaF_2$ type crystal structure, the material whose main phase is $FeSi_2$ having a crystal structure belonging to the space group Cmca, and the material whose main phase is CoSi having a B20 type crystal structure.

The above-described material whose main phase is $Bi_2Te_{3-x}Se_x$ ($0<x<3$) having a crystal structure belonging to the space group R-3m may contain an element other than Bi, Te, and Se constituting the main phase, or may contain two or more kinds of such elements. The elements other than Bi, Te and Se may include a sulfur element and halogen elements. The halogen element is preferably I, Br or Cl from the standpoint of improving the physical property value zT of the thermoelectric conversion material contained in the thermoelectric conversion module member of the present invention.

The content of the elements other than Bi, Te and Se contained in the above-described material whose main phase is $Bi_2Te_{3-x}Se_x$ ($0<x<3$) having a crystal structure belonging to the space group R-3m is preferably 10% by mol or less, and more preferably 5% by mol or less for one element when the substance amount of Bi contained in the material whose main phase is $Bi_2Te_{3-x}Se_x$ is taken as 100% by mol from the standpoint of heat resistance of the thermoelectric conversion module member.

The above-described material whose main phase is $Bi_{2-y}Sb_yTe_3$ ($0\leq y\leq 2$) having a crystal structure belonging to the space group R-3m may contain an element other than Bi, Sb and Te constituting the main phase, or may contain two or more kinds of such elements. The elements other than Bi, Sb and Te may include an alkali metal element or an alkaline earth metal element. The alkali metal element includes Li, Na or K, and the alkaline earth metal element includes Mg, Ca or Ba. It is preferable to contain Mg or Ca, from the standpoint of improving the physical property value zT of the thermoelectric conversion material contained in the thermoelectric conversion module member of the present invention.

The content of the elements other than Bi, Sb and Te contained in the above-described material whose main phase is $Bi_{2-y}Sb_yTe_3$ ($0\leq y\leq 2$) having a crystal structure belonging to the space group R-3m is preferably 10% by mol or less, and more preferably 5% by mol or less for one element when the substance amount of Bi contained in the material whose main phase is $Bi_{2-y}Sb_yTe_3$ is taken as 100% by mol from the standpoint of heat resistance of the thermoelectric conversion module member.

The above-described material whose main phase is GeTe having a crystal structure belonging to the space group R3m may contain an element other than Ge and Te constituting the main phase, or may contain two or more kinds of such elements. The elements other than Ge and Te may include a Group 14 element, a Group 15 element, a Group 16 element, or a transition metal element. The Group 14 element includes Pb, Sn and Si, and Pb or Sn is preferable from the standpoint of reducing the lattice thermal conductivity. The Group 15 element includes As, Bi or Sb, and it is preferable to contain Bi or Sb from the standpoint of improving the physical property value zT of the thermoelectric conversion material contained in the thermoelectric conversion module member of the present invention. The Group 16 element includes S or Se, and it is preferable to contain Se from the standpoint of improving the physical property value zT of the thermoelectric conversion material contained in the thermoelectric conversion module member of the present invention. The transition metal element includes Ti, Cr, Mn, Fe, Co, Ni, Cu, Mo, Rh, Ag or Hf, and it is preferable to contain Cu or Ag from the standpoint of improving the physical property value zT of the thermoelectric conversion material contained in the thermoelectric conversion module member of the present invention.

The content of the elements other than Ge and Te contained in the above-described material whose main phase is GeTe having a crystal structure belonging to the space group R3m is preferably 30% by mol or less, and more preferably 20% by mol or less for one element when the substance amount of Te contained in the material whose main phase is GeTe is taken as 100% by mol from the standpoint of heat resistance of the thermoelectric conversion module member.

When the elements other than Ge and Te contained in the above-described material whose main phase is GeTe having a crystal structure belonging to the space group R3m are two or more kinds of elements, they are preferably at least two elements selected from the group consisting of Sb, Ag, Bi and Cu from the standpoint of improving the physical property value zT of the thermoelectric conversion material contained in the thermoelectric conversion module member of the present invention.

When the elements other than Ge and Te contained in the above-described material whose main phase is GeTe having a crystal structure belonging to the space group R3m are Bi and Cu, the content of Bi or Cu is preferably 20% by mol or less, and more preferably 10% by mol or less when the substance amount of Te contained in the material whose main phase is GeTe is taken as 100% by mol and the maximum diameter of the crystal of Bi and Cu contained in the material is preferably less than 2.0 μm from the standpoint of improving the physical property value zT of the thermoelectric conversion material contained in the thermoelectric conversion module member of the present invention.

The above-described material whose main phase is $GeBi_2Te_4$ having a crystal structure belonging to the space group R-3m may contain an element other than Ge, Bi and Te constituting the main phase.

The above-described material whose main phase is $GeBi_4Te_7$ having a crystal structure belonging to the space group P-3m1 may contain an element other than Ge, Bi and Te constituting the main phase, and Cu or Sb may be contained as the element other than Ge, Bi and Te.

The content of the elements other than Ge, Bi and Te contained in the above-described material whose main phase is GeBi$_4$Te$_7$ having a crystal structure belonging to the space group R-3m1 is preferably 0.20% by mol or less for Cu and preferably 50% by mol or less for Sb when the substance amount of Ge contained in the material whose main phase is GeBi$_4$Te$_7$ is taken as 100% by mol from the standpoint of improving the physical property value zT of the thermoelectric conversion material contained in the thermoelectric conversion module member of the present invention.

The above-described material whose main phase is SnTe having a crystal structure belonging to the space group Fm-3m may contain an element other than Sn and Te constituting the main phase, or may contain two or more kinds of such elements. Se or I may be contained as the element other than Sn and Te.

The content of the elements other than Sn and Te contained in the above-described material whose main phase is SnTe having a crystal structure belonging to the space group Fm-3m is preferably 30% by mol or less for Se and preferably 5% by mol or less for I when the substance amount of Sn contained in the material whose main phase is SnTe is taken as 100% by mol from the standpoint of improving the physical property value zT of the thermoelectric conversion material contained in the thermoelectric conversion module member of the present invention.

The above-described material whose main phase is PbTe having a crystal structure belonging to the space group Fm-3m may contain an element other than Pb and Te constituting the main phase, or may contain two or more kinds of such elements. Na or I may be contained as the element other than Pb and Te.

The content of the Na element contained in the above-described material whose main phase is PbTe having a crystal structure belonging to the space group Fm-3m is preferably 5% by mol or less when the substance amount of Pb contained in the material whose main phase is PbTe is taken as 100% by mol from the standpoint of heat resistance of the thermoelectric conversion module member.

The content of the I element contained in the above-described material whose main phase is PbTe having a crystal structure belonging to the space group Fm-3m is preferably 1% by mol or less when the substance amount of Pb contained in the material whose main phase is PbTe is taken as 100% by mol from the standpoint of heat resistance of the thermoelectric conversion module member.

The above-described material whose main phase is Mg$_2$Si$_{1-z}$Sn$_z$ ($0 \leq z < 1$) having a CaF$_2$ type crystal structure may contain an element other than Mg, Si and Sn constituting the main phase, or may contain two or more kinds of such elements. Bi, Sb, Te or Ge may be contained as the element other than Mg, Si and Sn.

The content of the elements other than Mg, Si and Sn contained in the above-described material whose main phase is Mg$_2$Si$_{1-z}$Sn$_z$ ($0 \leq z < 1$) having a CaF$_2$ type crystal structure is preferably 20% by mol or less, and more preferably 10% by mol or less for one element when the substance amount of Mg contained in the material whose main phase is Mg$_2$Si$_{1-z}$Sn$_z$ ($0 \leq z < 1$) is taken as 100% by mol from the standpoint of improving the physical property value zT of the thermoelectric conversion material contained in the thermoelectric conversion module member of the present invention.

The above-described material whose main phase is FeSi$_2$ having a crystal structure belonging to the space group Cmca may contain an element other than Fe and Si constituting the main phase, or may contain two or more kinds of such elements. Cr or Co may be contained as the element other than Fe and Si.

The content of the elements other than Fe and Si contained in the above-described material whose main phase is FeSi$_2$ having a crystal structure belonging to the space group Cmca is preferably 10% by mol or less for one element when the substance amount of Fe contained in the material whose main phase is FeSi$_2$ is taken as 100% by mol from the standpoint of improving the physical property value zT of the thermoelectric conversion material contained in the thermoelectric conversion module member of the present invention.

The above-described material whose main phase is MnSi$_\gamma$ ($1.7 \leq \gamma \leq 1.8$) having a chimney-ladder type crystal structure may contain an element other than Mn and Si constituting the main phase, or may contain two or more kinds of such elements. Al, Ge, Cr or Fe may be contained as the element other than Mn and Si.

The content of the elements other than Mn and Si contained in the above-described material whose main phase is MnSi$_\gamma$ ($1.7 \leq \gamma \leq 1.8$) having a chimney-ladder type crystal structure is preferably 20% by mol or less, and more preferably 10% by mol or less for one element when the substance amount of Mn contained in the material whose main phase is MnSi$_\gamma$ ($1.7 \leq \gamma \leq 1.8$) is taken as 100% by mol from the standpoint of improving the physical property value zT of the thermoelectric conversion material contained in the thermoelectric conversion module member of the present invention.

The above-described material whose main phase is CoSi having a B20 type crystal structure may contain an element other than Co and Si constituting the main phase, or may contain two or more kinds of such elements. Al, Ni, Pd, Pt or Cu may be contained as the element other than Co and Si. The above-described material whose main phase is CoSi having a B20 type crystal structure can become an n-type thermoelectric conversion material when Ni or Pd is contained as the dopant element, and can become a p-type thermoelectric conversion material when Al is contained as the dopant element.

The content of the elements other than Co and Si contained in the above-described material whose main phase is CoSi having a B20 type crystal structure is preferably 10% by mol or less for one element when the substance amount of Co contained in the material whose main phase is CoSi is taken as 100% by mol from the standpoint of improving the physical property value zT of the thermoelectric conversion material contained in the thermoelectric conversion module member of the present invention.

The thermoelectric conversion material contained in the thermoelectric conversion module member of the present invention is preferably the material whose main phase is GeTe having a crystal structure belonging to the space group R3m, the material whose main phase is GeBi$_2$Te$_4$ having a crystal structure belonging to the space group R-3m, the material whose main phase is GeBi$_4$Te$_7$ having a crystal structure belonging to the space group P-3m1, the material whose main phase is SnTe having a crystal structure belonging to the space group Fm-3m, the material whose main phase is Mg$_2$Si$_{1-z}$Sn$_z$ ($0 \leq z < 1$) having a CaF$_2$ type crystal structure, or the material whose main phase is MnSi$_\gamma$ ($1.7 \leq \gamma \leq 1.8$) having a chimney-ladder type crystal structure, at 25° C., more preferably the material whose main phase is GeTe having a crystal structure belonging to the space group R3m, or the material whose main phase is MnSi$_\gamma$ ($1.7 \leq \gamma \leq 1.8$) having a chimney-ladder type crystal structure, and further preferably Ge$_{0.95}$Bi$_{0.05}$Cu$_{0.03}$Te, or MnSi$_{1.73}$, from the standpoint of heat resistance and durability.

The thermoelectric conversion material in the thermoelectric conversion layer may be contained alone or in combination of two or more.

The thermoelectric conversion layer provided in the thermoelectric conversion module member of the present invention may include "other materials other than thermoelectric conversion materials" that are not the thermoelectric conversion materials, and examples of such materials include oxides such as $Al_2O_3$, $SiO_2$, and the like.

Other materials other than the thermoelectric conversion material in the thermoelectric conversion layer may be contained alone or in combination of two or more.

The content of the above-described thermoelectric conversion material in the thermoelectric conversion layer provided in the thermoelectric conversion module member of the present invention is preferably 95% by mass or more when the total amount of all compounds in the above-described thermoelectric conversion layer is taken as 100% by mass from the standpoint of improving the physical property value zT of the thermoelectric conversion material contained in the thermoelectric conversion module member of the present invention.

The content of the above-described "other materials other than thermoelectric conversion materials" in the thermoelectric conversion layer provided in the thermoelectric conversion module member of the present invention is preferably 5% by mass or less when the total amount of all compounds in the above-described thermoelectric conversion layer is taken as 100% by mass from the standpoint of improving the physical property value zT of the thermoelectric conversion material contained in the thermoelectric conversion module member of the present invention.

The film thickness of the thermoelectric conversion layer is not particularly limited, but, from the standpoint of improving the thermoelectric conversion efficiency of the thermoelectric conversion module of the present invention, it is preferably 100 μm or more, more preferably 500 μm or more, and further preferably 1000 μm or more, and from the standpoint of excellent mechanical durability, it is preferably 5 cm or less, more preferably 2 cm or less, and further preferably 1 cm or less. The above-mentioned upper limits and lower limits can be arbitrarily combined.

<Diffusion Prevention Layer>

The diffusion prevention layer provided in the thermoelectric conversion module member of the present invention is a layer containing a metal and the same thermoelectric conversion material as the thermoelectric conversion material contained in the thermoelectric conversion layer.

The thermoelectric conversion material in the diffusion prevention layer may be contained alone or in combination of two or more.

In the diffusion prevention layer, the amount of the above-described thermoelectric conversion material is 10 to 50 parts by weight, preferably 11 to 45 parts by weight, more preferably 25 to 45 parts by weight, and particularly preferably 35 to 43 parts by weight with respect to 100 parts by weight of the above-described metal.

The metal contained in the diffusion prevention layer provided in the thermoelectric conversion module member of the present invention includes Al or a transition metal and is preferably a transition metal from the standpoint of the connecting property between the thermoelectric conversion layer and the diffusion prevention layer.

Among the transition metals, transition metals having a melting point of 500° C. or higher are preferable, 3d transition metals, 4d transition metals or Ta are more preferable, 3d transition metals or 4d transition metals are further preferable, and 3d transition metals (among others, Ni) are particularly preferable. The 3d transition metal includes, for example, Ti, V, Cr, Mn, Fe, Co, Ni or Cu, with Mn, Fe, Co, Ni or Cu being preferred, and Fe, Co or Ni being more preferred. The 4d transition metal includes, for example, Y, Zr, Nb, Mo, Tc, Ru, Rh, Pd or Ag, with Nb, Mo, Pd or Ag being preferred.

The metal contained in the diffusion prevention layer may be an alloy composed of different metals. Among them, an alloy composed of a transition metal is preferable, and an alloy composed of a 3d transition metal is preferable. Specific examples thereof include Cr—Ni, Co—Fe, Fe—Cr, Fe—Ni or Ni—Co alloy, and the like.

The metal in the diffusion prevention layer may be contained alone or in combination of two or more.

The thermoelectric conversion material and the metal in the diffusion prevention layer preferably form a sea-island phase separation structure.

The sea-island phase separation structure is a phase separation structure having a sea-like thermoelectric conversion material region and an island-like metal region, which are incompatible with each other.

The sea-like thermoelectric conversion material region is a region where the thermoelectric conversion material is present, and the island-like metal region is a region where particles of the metal or an aggregate of the particles are present (hereinafter, referred to as island-like phase in some cases).

By having such a structure, the connecting property between the thermoelectric conversion layer and the diffusion prevention layer is improved.

As a method of observing the sea-island phase separation structure, for example, a method of observing the cross section of the diffusion prevention layer using a scanning electron microscope (SEM) can be mentioned. Further, the SEM-EDX method (Energy Dispersive X-ray Spectroscopy, energy dispersive X-ray spectroscopy), which is a method for performing elemental analysis and composition analysis by detecting characteristic X-rays generated by electron beam irradiation and spectrally analyzing with energy, can give information about the composition.

The shape of the above-described island-like phase is spherical or distorted spherical, and is not particularly limited. The metal forming the island-like phase is preferably in the form of particles. By the form of particles, the sea-island phase separation structure is easily formed, and the connecting property between the thermoelectric conversion layer and the diffusion prevention layer provided in the thermoelectric conversion module member of the present invention is improved. The particle diameter of the metal is not particularly limited, but is preferably 200 μm or less, and more preferably 150 μm or less.

The film thickness of the diffusion prevention layer is not particularly limited, but is preferably 100 μm or more and 5000 μm or less, more preferably 200 or more and 2000 μm or less, and particularly preferably 250 μm or more and 1000 μm or less from the standpoint of improving the connecting property between the thermoelectric conversion layer and the diffusion prevention layer provided in the thermoelectric conversion module member of the present invention.

As the "other component" other than the metal and the thermoelectric conversion material in the diffusion prevention layer, an oxide that is not the thermoelectric conversion material may be contained, and examples thereof include $Al_2O_3$ and $SiO_2$. Since the diffusion prevention layer contains an oxide that is not the thermoelectric conversion material, the hardness of the thermoelectric conversion module member can be improved The other components in the diffusion prevention layer may be contained alone or in combination of two or more.

The content of the "other component" in the diffusion prevention layer provided in the thermoelectric conversion module member of the present invention is preferably 5% by mass or less when the total amount of all compounds in the above-described diffusion prevention layer is taken as 100% by mass from the standpoint of improving the physical property value zT of the thermoelectric conversion material contained in the thermoelectric conversion module member of the present invention.

<Thermoelectric Conversion Module Member>

The thermoelectric conversion module member of the present invention has at least one layer of the thermoelectric conversion layer and at least one layer of the diffusion prevention layer, with the layers being in contact.

When two or more layers of each of the thermoelectric conversion layer and the diffusion prevention layer are present in the thermoelectric conversion module member of the present invention, the thermoelectric conversion material contained in the at least one thermoelectric conversion layer and the thermoelectric conversion material contained in the at least one diffusion prevention layer in contact with the thermoelectric conversion layer may advantageously be the same. In addition, when two or more thermoelectric conversion materials are contained in the thermoelectric conversion layer and/or the diffusion prevention layer in the thermoelectric conversion module member of the present invention, the at least one thermoelectric conversion material contained in the thermoelectric conversion layer and the at least one thermoelectric conversion material contained in the diffusion prevention layer in contact with the thermoelectric conversion layer may advantageously be the same.

FIG. 1 is a schematic sectional view showing the structure of the thermoelectric conversion module member (a) that is an embodiment of the present invention. This thermoelectric conversion module member is a stacking layer structure in which a diffusion prevention layer 2 and a thermoelectric conversion layer 3 are adjacently connected in this order.

In another embodiment of the present invention, the thermoelectric conversion module member (b) is a stacking layer structure in which a diffusion prevention layer, a thermoelectric conversion layer and a diffusion prevention layer are adjacently connected in this order. In this configuration, the two diffusion prevention layers adjacent to the thermoelectric conversion layer may be the same as or different from each other, and the thermoelectric conversion material contained in the thermoelectric conversion layer and the thermoelectric conversion material contained in the at least one diffusion prevention layer in contact with the thermoelectric conversion layer may advantageously be the same.

In another embodiment of the present invention, the thermoelectric conversion module member (c) is a stacking layer structure in which a diffusion prevention layer, a thermoelectric conversion layer and a thermoelectric conversion layer are adjacently connected in this order. In this configuration, the two adjacent thermoelectric conversion layers may be the same as or different from each other. When the thermoelectric conversion materials in the two thermoelectric conversion layers are different from each other, the thermoelectric conversion material contained in the diffusion prevention layer and the thermoelectric conversion material contained in the thermoelectric conversion layer in contact with the diffusion prevention layer may advantageously be the same.

In another embodiment of the present invention, the thermoelectric conversion module member (d) is a stacking layer structure in which a thermoelectric conversion layer, a diffusion prevention layer and a thermoelectric conversion layer are adjacently connected in this order. The two thermoelectric conversion layers adjacent to the diffusion prevention layer may be the same as or different from each other. When the thermoelectric conversion materials in the two thermoelectric conversion layers are different from each other, the thermoelectric conversion material in the diffusion prevention layer may advantageously be the same as the thermoelectric conversion material contained in the at least one thermoelectric conversion layer of the two thermoelectric conversion layers in contact with the diffusion prevention layer, and the thermoelectric conversion material in the diffusion prevention layer may be a thermoelectric conversion material obtained by arbitrarily blending the thermoelectric conversion materials contained respectively in the two thermoelectric conversion layers.

In another embodiment of the present invention, the thermoelectric conversion module member (e) is a stacking layer structure in which a thermoelectric conversion layer, a diffusion prevention layer and a diffusion prevention layer adjacently connected in this order. The two adjacent diffusion prevention layers may be the same as or different from each other, and the thermoelectric conversion material contained in the thermoelectric conversion layer and the thermoelectric conversion material contained in the diffusion prevention layer in contact with the thermoelectric conversion layer may advantageously be the same. When the content of the thermoelectric conversion material in one diffusion prevention layer in contact with the thermoelectric conversion layer is higher than the content of the thermoelectric conversion material in the other diffusion prevention layer of the two diffusion prevention layers, the thermoelectric conversion module having the thermoelectric conversion module member (e) is less likely to cause peeling by heating since the change in the coefficient of linear thermal expansion is reduced, thereby improving the connecting property between the respective layers.

In another embodiment of the present invention, the thermoelectric conversion module member (f) is a stacking layer structure in which a thermoelectric conversion layer, a diffusion prevention layer, a thermoelectric conversion layer, a diffusion prevention layer and a thermoelectric conversion layer are adjacently connected in this order. The two diffusion prevention layers may be the same as or different from each other. The three thermoelectric conversion layers may be the same as or different from each other. When the thermoelectric conversion materials in the two thermoelectric conversion layers in contact with one of the two diffusion prevention layers, among the above-described three thermoelectric conversion layers, are different from each other, the thermoelectric conversion material in the diffusion prevention layer may advantageously be the same as the thermoelectric conversion material contained in the thermoelectric conversion layer in contact only with the diffusion prevention layer of the above-described two thermoelectric conversion layers in contact with the diffusion prevention layer, and may also be a thermoelectric conversion material obtained by arbitrarily blending the thermoelectric conversion materials contained in the respective two thermoelectric conversion layers in contact with the diffusion prevention layer.

The thermoelectric conversion module member of the present invention may have a layer other than the thermoelectric conversion layer and the diffusion prevention layer.

<Thermoelectric Conversion Module>

The thermoelectric conversion module of the present invention has a pair of electrodes, and the above-described thermoelectric conversion module member disposed between the pair of electrodes. Further, the thermoelectric conversion module of the present invention may have components other than the pair of electrodes and the thermoelectric conversion module member.

FIGS. 2 and 3 are schematic cross-sectional views showing the structure of a thermoelectric conversion module that is an embodiment of the present invention. In the thermoelectric conversion module 5-$b$ in FIG. 2, when an electrode 4-$a$ at the heating side (in the present specification, called a higher temperature side electrode in some cases) is heated, a potential difference is generated between an electrode 4-$b$ at the non-heating side (in the present specification, called a lower temperature side electrode in some cases) and the higher temperature side electrode 4-$a$. For example, when the thermoelectric conversion material contained in the thermoelectric conversion layer of the thermoelectric conversion module 5-$a$ is a p-type thermoelectric conversion material whose carrier is hole, the lower temperature side electrode 4-$b$ has a higher potential than the higher temperature side electrode 4-$a$.

At this time, by electrically connecting the external load 6 between the higher temperature side electrode 4-$a$ and the lower temperature side electrode 4-$b$ by the wirings 7 and 8, an electric current flows from the wiring 8 toward the wiring 7 via the external load 6.

In one embodiment of the present invention, the thermoelectric conversion module is a stacking layer structure in which a higher temperature side electrode, a diffusion prevention layer, a thermoelectric conversion layer, a thermoelectric conversion layer and a lower temperature side electrode are adjacently connected in this order. The two thermoelectric conversion layers may be the same as or different from each other.

In one embodiment of the present invention, the thermoelectric conversion module is a stacking layer structure in which a higher temperature side electrode, a diffusion prevention layer, a thermoelectric conversion layer, a diffusion prevention layer, a thermoelectric conversion layer and a lower temperature side electrode are adjacently connected in this order. The two diffusion prevention layers may be the same as or different from each other. The two thermoelectric conversion layers may be the same as or different from each other.

In one embodiment of the present invention, the thermoelectric conversion module is a stacking layer structure in which a higher temperature side electrode, a diffusion prevention layer, a thermoelectric conversion layer, a diffusion prevention layer, a thermoelectric conversion layer, a diffusion prevention layer and a lower temperature side electrode are adjacently connected in this order. The three diffusion prevention layers may be the same as or different from each other. The two thermoelectric conversion layers may be the same as or different from each other.

The above-described pair of electrodes provided in the thermoelectric conversion module of the present invention are not particularly restricted, but metals having high electric conductivity are used. For example, Al and transition metals are mentioned. As the transition metal, a 3d transition metal is preferable, and Fe, Cu or Ni is more preferable.

The pair of electrodes may be the same metal or different metals.

The electrodes and the thermoelectric conversion module member provided in the thermoelectric conversion module of the present invention may be fixed by soldering, brazing or welding. Examples of the solder include a solder containing In (for example, In—Ga solder), a solder containing Pb, or a solder containing Sn. Examples of the brazing material used for brazing include a brazing material containing Ag, a brazing material containing Pb, a brazing material containing Sn or a brazing material containing Al.

In one embodiment of the present invention, the thermoelectric conversion module may have a plurality of thermoelectric conversion layers electrically connected via electrodes, and as such a thermoelectric conversion module, for example, a thermoelectric conversion module of FIG. 3 is cited.

In the thermoelectric conversion module 5-$c$ shown in FIG. 3, a p-type thermoelectric conversion module member 1-$a$ having a p-type thermoelectric conversion layer 3-$a$ using a p-type thermoelectric conversion material whose carrier is a hole and a diffusion prevention layer 2-$a$, and an n-type thermoelectric conversion module member 1-$b$ having an n-type thermoelectric conversion layer 3-$b$ using an n-type thermoelectric conversion material whose carrier is an electron and a diffusion prevention layer 2-$b$ are arranged in the form of $\pi$ via a higher temperature side electrode 4-$a$. When the higher temperature side electrode 4-$a$ side of the thermoelectric conversion module 5-$c$ of FIG. 3 is heated, the lower temperature side electrode 4-$b$ gets higher potential than the lower temperature side electrode 4-$b'$ due to temperature difference. At this time, by electrically connecting the external load 6 between the lower temperature side electrode 4-$b$ and the lower temperature side electrode 4-$b'$ by the wiring 7 and the wiring 8, an electric current flows from the wiring 8 toward the wiring 7 via the external load 6.

<Method for Producing Thermoelectric Conversion Module Member>

The method for producing a thermoelectric conversion module member of the present invention is a method for producing a thermoelectric conversion module member having a thermoelectric conversion layer and a diffusion prevention layer in contact with the above-described thermoelectric conversion layer, comprising a first step of disposing one of the following material (1) and the following material (2) or a sintered body thereof in a molding die, to form a first layer;

a second step of disposing the other of the above-described material (1) and the above-described material (2) or a sintered body thereof in the above-described molding die so as to be in contact with the first layer formed in the above-described first step, to form a second layer thereby obtaining a stacking layer structure, and a sintering step of sintering the stacking layer structure obtained in the second step, to obtain the thermoelectric conversion module member:

Material (1): a thermoelectric conversion material containing a silicon element or a tellurium element Material (2): a composition containing a metal and the same thermoelectric conversion material as the above-described material (1) at a proportion of 10 to 50 parts by weight of the above-described thermoelectric conversion material with respect to 100 parts by weight of the above-described metal.

The material (1) is the same as the thermoelectric conversion material having a silicon element or a tellurium element in the thermoelectric conversion layer provided in the above-described thermoelectric conversion module member explained already.

In the material (1), the average particle diameter of the thermoelectric conversion material is preferably 100 μm or less, and more preferably 50 μm or less. In the thermoelectric conversion layer having the thermoelectric conversion material having the average particle diameter in the above range, the thermal conductivity is reduced, and the thermoelectric conversion efficiency of the thermoelectric conversion module including the thermoelectric conversion layer is improved.

In the material (1), the thermoelectric conversion material may be contained alone or in combination of two or more.

The material (2) is a composition containing a metal and the same thermoelectric conversion material as the material (1) at a proportion of 10 to 50 parts by weight, preferably 11 to 45 parts by weight, more preferably 25 to 45 parts by weight, and further preferably 35 to 43 parts by weight of the thermoelectric conversion material with respect to 100 parts by weight of the metal.

The metal as the material (2) is the same as the metal contained in the diffusion prevention layer provided in the above-described thermoelectric conversion module member explained already.

In the material (2), the metal is preferably in the form of particles. The particle diameter of the metal is not particularly limited, but is preferably 200 μm or less, and more preferably 150 μm or less. By using metal particles, the material (2) easily forms the above-described sea-island phase separation structure which is a phase separation structure having a sea-like material (1) region and an island-like metal region. The thermoelectric conversion module member obtained by the production method using such a material (2) has an improved connecting property between the thermoelectric conversion layer and the diffusion prevention layer.

In the material (2), the thermoelectric conversion materials and metals may each be contained singly or in combination of two or more.

In the material (2), the particle diameter of the thermoelectric conversion material as the material (1) is preferably 100 μm or less, and more preferably 50 μm or less from the standpoint of easy formation of the above-described sea-island phase separation structure from the material (2). The thermoelectric conversion module member obtained by the production method using such a material (2) shows an improved connecting property between the thermoelectric conversion layer and the diffusion prevention layer.

In the material (2), the amount of the thermoelectric conversion material is preferably 11 to 45 parts by weight, more preferably 15 to 45 parts by weight, and particularly preferably 25 to 45 parts by with respect to 100 parts by weight of the metal from the standpoint of heat resistance of the thermoelectric conversion module member. The thermoelectric conversion module member obtained by the production method using the material (2) in which the proportion of the metal and the thermoelectric conversion material is within this range has an improved connecting property between the thermoelectric conversion layer and the diffusion prevention layer.

In the material (2), if uniformly mixing the metal and the material (1), this method is not particularly limited, but a method using a ball mill is mentioned. By pulverizing by a ball mill, a uniform composition is obtained, and each component can be adjusted to the desired particle size.

The sintered body is a molded body obtained by a sintering process.

The sintering process is not particularly limited, and examples thereof include a hot press sintering method, a spark plasma sintering method, and the like. The hot press sintering method is preferably a high frequency hot pressing method, and the spark plasma sintering method is preferably a spark plasma sintering method in which an electric current is applied to an object to be processed and the object is sintered by internal heating. The hot press sintering method is preferable from the standpoint of obtaining a high-density sintered body. When pressure is applied in the hot press sintering method or the spark plasma sintering method, the applied pressure is preferably 30 MPa or more. Sintering is preferably performed at a temperature of ⅔ or more of the melting point of the material (1) in terms of absolute temperature. The sintering time is not particularly limited, but is preferably 5 minutes or more.

A high-density sintered body is obtained by such a sintering method, and the thermoelectric conversion module member produced using this sintered body has an improved connecting property between the diffusion prevention layer and the thermoelectric conversion layer.

The molding die is not particularly limited, but includes a die and a punch made of carbon for spark plasma sintering, or a metal die, and the like.

The method for producing a thermoelectric conversion module member of the present invention may be, for example, the following production methods (a-1) to (a-4).

Production method (a-1): a method for producing a thermoelectric conversion module member having
a first step of disposing a powder of one of the above-described material (1) and the above-described material (2) in a molding die, to form a first layer,
a second step of disposing a sintered body of the other of the above-described material (1) and the above-described material (2) in the above-described molding die so as to be in contact with the first layer formed in the above-described first step, to form a second layer thereby obtaining a stacking layer structure, and
a sintering step of sintering the stacking layer structure obtained in the second step, to obtain the thermoelectric conversion module member.

Production method (a-2): a method for producing a thermoelectric conversion module member having
a first step of disposing a sintered body of one of the above-described material (1) and the above-described material (2) in a molding die, to form a first layer,
a second step of disposing a powder of the other of the above-described material (1) and the above-described material (2) in the above-described molding die so as to be in contact with the first layer formed in the above-described first step, to form a second layer thereby obtaining a stacking layer structure, and
a sintering step of sintering the stacking layer structure obtained in the second step, to obtain the thermoelectric conversion module member.

Production method (a-3): a method for producing a thermoelectric conversion module member having
a first step of disposing a powder of one of the above-described material (1) and the above-described material (2) in a molding die, to form a first layer,
a second step of disposing a powder of the other of the above-described material (1) and the above-described material (2) in the above-described molding die so as to be in contact with the first layer formed in the above-described first step, to form a second layer thereby obtaining a stacking layer structure, and a sintering step of sintering the stacking layer structure obtained in the second step, to obtain the thermoelectric conversion module member.

Production method (a-4): a method for producing a thermoelectric conversion module member having a first step of disposing a sintered body of one of the above-described material (1) and the above-described material (2) in a molding die, to form a first layer, a second step of disposing a sintered body of the other of the above-described material (1) and the above-described material (2) in the above-described molding die so as to be in contact with the first layer formed in the above-described first step, to form a second layer thereby obtaining a stacking layer structure, and a sintering step of sintering the stacking layer structure obtained in the second step, to obtain the thermoelectric conversion module member.

The method for producing a thermoelectric conversion module member of the present invention may also be a production method comprising further disposing the same material as the above-described first layer or a sintered body thereof, of the above-described material (1) and the above-described (2), on the opposite side of the first layer (i.e., opposite side across the second layer as seen from the first layer) so as to be in contact with the above-described second layer of the stacking layer structure obtained in the above-described second step, to form a third layer thereby obtaining a stacking layer structure, in the second step.

The method for producing a thermoelectric conversion module member of the present invention includes, for example, the following production methods (b-1) to (b-8).

Production method (b-1): a method for producing a thermoelectric conversion module member having a first step of disposing a powder of one of the above-described material (1) and the above-described material (2) in a molding die, to form a first layer, a second step of disposing a powder of the other of the above-described material (1) and the above-described material (2) in the above-described molding die so as to be in contact with the first layer formed in the above-described first step, to form a second layer thereby obtaining a stacking layer structure, a third step of disposing a powder of the above-described material (1) or the above-described material (2) in the above-described molding die so as to be in contact with the above-described second layer of the stacking layer structure obtained in the above-described second step, to form a third layer thereby obtaining a stacking layer structure, and a sintering step of sintering the stacking layer structure obtained in the third step, to obtain the thermoelectric conversion module member.

Production method (b-2): a method for producing a thermoelectric conversion module member having a first step of disposing a sintered body of one of the above-described material (1) and the above-described material (2) in a molding die, to form a first layer, a second step of disposing a powder of the other of the above-described material (1) and the above-described material (2) in the above-described molding die so as to be in contact with the first layer formed in the above-described first step, to form a second layer thereby obtaining a stacking layer structure, a third step of disposing a powder of the above-described material (1) or the above-described material (2) in the above-described molding die so as to be in contact with the above-described second layer of the stacking layer structure obtained in the above-described second step, to form a third layer thereby obtaining a stacking layer structure, and a sintering step of sintering the stacking layer structure obtained in the third step, to obtain the thermoelectric conversion module member.

Production method (b-3): a method for producing a thermoelectric conversion module member having a first step of disposing a powder of one of the above-described material (1) and the above-described material (2) in a molding die, to form a first layer, a second step of disposing a sintered body of the other of the above-described material (1) and the above-described material (2) in the above-described molding die so as to be in contact with the first layer formed in the above-described first step, to form a second layer thereby obtaining a stacking layer structure, a third step of disposing a powder of the above-described material (1) or the above-described material (2) in the above-described molding die so as to be in contact with the above-described second layer of the stacking layer structure obtained in the above-described second step, to form a third layer thereby obtaining a stacking layer structure, and a sintering step of sintering the stacking layer structure obtained in the third step, to obtain the thermoelectric conversion module member.

Production method (b-4): a method for producing a thermoelectric conversion module member having a first step of disposing a powder of one of the above-described material (1) and the above-described material (2) in a molding die, to form a first layer, a second step of disposing a powder of the other of the above-described material (1) and the above-described material (2) in the above-described molding die so as to be in contact with the first layer formed in the above-described first step, to form a second layer thereby obtaining a stacking layer structure, a third step of disposing a sintered body of the above-described material (1) or the above-described material (2) in the above-described molding die so as to be in contact with the above-described second layer of the stacking layer structure obtained in the above-described second step, to form a third layer thereby obtaining a stacking layer structure, and a sintering step of sintering the stacking layer structure obtained in the third step, to obtain the thermoelectric conversion module member.

Production method (b-5): a method for producing a thermoelectric conversion module member having a first step of disposing a sintered body of one of the above-described material (1) and the above-described material (2) in a molding die, to form a first layer, a second step of disposing a sintered body of the other of the above-described material (1) and the above-described material (2) in the above-described molding die so as to be in contact with the first layer formed in the above-described first step, to form a second layer thereby obtaining a stacking layer structure, a third step of disposing a powder of the above-described material (1) or the above-described material (2) in the above-described molding die so as to be in contact with the above-described second layer of the stacking layer structure obtained in the above-described second step, to form a third layer thereby obtaining a stacking layer structure, and a sintering step of sintering the stacking layer structure obtained in the third step, to obtain the thermoelectric conversion module member.

Production method (b-6): a method for producing a thermoelectric conversion module member having a first step of disposing a sintered body of one of the above-described material (1) and the above-described material (2) in a molding die, to form a first layer, a second step of disposing a powder of the other of the above-described material (1) and the above-described material (2) in the above-described molding die so as to be in contact with the first layer formed in the above-described first step, to form a second layer thereby obtaining a stacking layer structure, a third step of disposing a sintered body of the above-described material (1) or the above-described material (2) in the above-described molding die so as to be in contact with the above-described second layer of the stacking layer structure obtained in the above-described second step, to form a third layer thereby obtaining a stacking layer structure, and a sintering step of sintering the stacking layer structure obtained in the third step, to obtain the thermoelectric conversion module member.

Production method (b-7): a method for producing a thermoelectric conversion module member having a first step of disposing a powder of one of the above-described material (1) and the above-described material (2) in a molding die, to form a first layer, a second step of disposing a sintered body of the other of the above-described material (1) and the above-described material (2) in the above-described molding die so as to be in contact with the first layer formed in the above-described first step, to form a second layer thereby obtaining a stacking layer structure, a third step of disposing a sintered body of the above-described material (1) or the above-described material (2) in the above-described molding die so as to be in contact with the above-described second layer of the stacking layer structure obtained in the above-described second step, to form a third layer thereby obtaining a stacking layer structure, and a sintering step of sintering the stacking layer structure obtained in the third step, to obtain the thermoelectric conversion module member.

Production method (b-8): a method for producing a thermoelectric conversion module member having a first step of disposing a sintered body of one of the above-described material (1) and the above-described material (2) in a molding die, to form a first layer, a second step of disposing a sintered body of the other of the above-described material (1) and the above-described material (2) in the above-described molding die so as to be in contact with the first layer formed in the above-described first step, to form a second layer thereby obtaining a stacking layer structure, a third step of disposing a sintered body of the above-described material (1) or the above-described material (2) in the above-described molding die so as to be in contact with the above-described second layer of the stacking layer structure obtained in the above-described second step, to form a third layer thereby obtaining a stacking layer structure, and a sintering step of sintering the stacking layer structure obtained in the third step, to obtain the thermoelectric conversion module member.

As the method for producing a thermoelectric conversion module member of the present invention, the above-described production methods (a-1) to (a-3), (b-1) to (b-4) or (b-6) are preferred, and the above-described method (b-1) is more preferable, among the above-described methods for producing a thermoelectric conversion module member having the above-described first step and the second step from the standpoint of the connecting property between the above-described thermoelectric conversion layer and the above-described diffusion prevention layer.

In the above-mentioned production methods, a powder disposed in a molding die in the first step and/or the second step may be sintered during that step.

In the method for producing a thermoelectric conversion module member of the present invention, it is preferable that the first layer is a diffusion prevention layer and the second layer is a thermoelectric conversion layer, and it is more preferable that the first layer is a diffusion prevention layer, the second layer is a thermoelectric conversion layer, and the third layer is a diffusion prevention layer.

The method for producing a thermoelectric conversion module member of the present invention may have other steps before and after the first step and/or the second step.

EXAMPLES

The present invention will be described below with reference to examples, but the present invention is not limited to these examples.

<Production of Material (1)>

[Material 1-1]

Raw material elements (Ge, Te, Cu, Bi) having a purity of 99.9% or more (Ge; manufactured by Furuuchi Chemical Corporation, Te and Bi; manufactured by Osaka Asahi Metal Mfg. Co., Ltd., Cu; manufactured by Kojundo Chemical Lab. Co., Ltd.) were mixed in a predetermined composition ratio so as to obtain a composition formula: $Ge_{0.95}Bi_{0.05}Cu_{0.03}Te$, and the mixture was vacuum sealed in a quartz tube ($2\times10^{-4}$ Pa), melted in an electric furnace (950° C.×5 hours), and then rapidly cooled with water. The obtained sample was pulverized in an agate mortar to obtain powdery polycrystalline body $Ge_{0.95}Bi_{0.05}Cu_{0.03}Te$ as a material 1-1.

[Material 1-2]

$MnSi_{1.73}$ manufactured by Toshima Manufacturing Co., Ltd. was pulverized in an agate mortar to obtain powdery $MnSi_{1.73}$ as a material 1-2.

<Production of Material (2)>

[Material 2-1]

A metal Ni powder (manufactured by Furuuchi Chemical Corporation, purity of 99.9% or more, −100 mesh) was used as a material 2-1. That is, the material 2-1 contains material (1):metal Ni=0:100 by weight.

[Material 2-2]

The material 1-1 (0.10 g) was mixed with a metal Ni powder (1.90 g, manufactured by Furuuchi Chemical Corporation, purity 99.9% or more, −100 mesh) to obtain a material 2-2. That is, the material 2-2 contains material (1):metal Ni=5:95 (weight basis).

[Material 2-3]

The material 1-1 (0.16 g) was mixed with a metal Ni powder (1.44 g, manufactured by Furuuchi Chemical Corporation, purity 99.9% or more, −100 mesh) to obtain a material 2-3. That is, the material 2-3 contains material (1):metal Ni=10:90 (weight basis).

[Material 2-4]

The material 1-1 (0.45 g) was mixed with a metal Ni powder (1.05 g, manufactured by Furuuchi Chemical Corporation, purity of 99.9% or more, −100 mesh) to obtain a material 2-4. That is, the material 2-4 contains material (1):metal Ni=30:70 (weight basis).

[Material 2-5]

The material 1-1 (1.74 g) was mixed with a metal Ni powder (1.74 g, manufactured by Furuuchi Chemical Corporation, purity 99.9% or more, −100 mesh) to obtain a material 2-5. That is, the material 2-5 contains material (1):metal Ni=50:50 (weight basis).

[Material 2-6]

The material 1-2 (0.10 g) was mixed with a metal Ni powder (0.90 g, manufactured by Furuuchi Chemical Corporation, purity of 99.9% or more, −100 mesh) to obtain a material 2-6. That is, the material 2-6 contains material (1):metal Ni=10:90 (weight basis).

<Production of Thermoelectric Conversion Module Member>

Example 1

A carbon punch was placed in a carbon die for spark plasma sintering, and after filling 0.3 g of the material 2-3, 2.5 g of the material 1-1 and 0.3 g of the material 2-3, the die was covered with the carbon punch. A sintering treatment was performed by sparkplasma sintering under the following conditions to obtain a thermoelectric conversion module member.
Equipment: DR. Sinter LAB SPS-511S (manufactured by Fuji Electronic Industrial Co., Ltd.)
Die: carbon die inner diameter: 10 mmφ
Atmosphere: Argon 0.05 MPa
Applied pressure: 40 MPa
Heating temperature: 550° C.
Holding time: 10 minutes Example 2

A carbon punch was placed in a carbon die for spark plasma sintering, and after filling 0.3 g of the material 2-4, 2.5 g of the material 1-1 and 0.3 g of the material 2-4, the die was covered with the carbon punch. A sintering treatment was performed by spark plasma sintering to obtain a thermoelectric conversion module member. The spark plasma sintering was conducted under the same conditions as in Example 1.

Example 3

A carbon punch was placed in a carbon die for spark plasma sintering, and after filling 0.3 g of the material 2-6, 1.1 g of the material 1-2 and 0.3 g of the material 2-6, the die was covered with the carbon punch. A sintering treatment was performed by spark plasma sintering to obtain a thermoelectric conversion module member. The spark plasma sintering was conducted under the same conditions as in Example 1 except that the heating temperature was 800° C.

Comparative Example 1

A carbon punch was placed in a carbon die for spark plasma sintering, and after filling 0.3 g of the material 2-1, 2.5 g of the material 1-1 and 0.3 g of the material 2-1, the die was covered with the carbon punch. A sintering treatment was performed by spark plasma sintering to obtain a thermoelectric conversion module member. The spark plasma sintering was conducted under the same conditions as in Example 1.

Comparative Example 2

A carbon punch was placed in a carbon die for spark plasma sintering, and after filling 0.3 g of the material 2-2, 2.5 g of the material 1-1 and 0.3 g of the material 2-2, the die was covered with the carbon punch. A sintering treatment was performed by spark plasma sintering to obtain a thermoelectric conversion module member. The spark plasma sintering was conducted under the same conditions as in Example 1.

Comparative Example 3

A carbon punch was placed in a carbon die for spark plasma sintering, and after filling 0.3 g of the material 2-5, 2.5 g of the material 1-1 and 0.3 g of the material 2-5, the die was covered with the carbon punch. A sintering treatment was performed by spark plasma sintering to obtain a thermoelectric conversion module member. The spark plasma sintering was conducted under the same conditions as in Example 1.

Comparative Example 4

A thermoelectric conversion module member was obtained in the same manner as in Example 1 except that the material 2-3 was no filled in Example 1.

For each thermoelectric conversion module member produced in Examples 1 to 3 and Comparative Examples 1 to 4, the presence or absence of peeling between the thermoelectric conversion layer and the diffusion prevention layer was visually observed. When no peeling was observed, the connecting property was evaluated as excellent, and when peeling was recognized, the connecting property was evaluated as poor.

<Heat Resistance Evaluation>

The initial resistivity $\rho$ (0) of each thermoelectric conversion module member produced in Examples 1 to 3 and Comparative Example 4 was measured. The resistivity measurement was performed by the following method. For a thermoelectric conversion module member cut out in a rectangular parallelepiped shape with the diffusion prevention layer as the bottom so that the height, width, and depth were 5 to 6 mm in height, 1 to 3 mm in width, and 1 to 3 mm in depth, the resistance value in the height direction of was measured by the two-terminal method. A copper plate was used for the terminal, and the terminal and the thermoelectric conversion module member were electrically connected by In—Ga solder. The initial resistivity $\rho$ (0) of the thermoelectric conversion module member was calculated from the obtained resistance value.

Next, a sample was prepared by uniformly coating the ceramic plate with In—Ga solder, and placing thereon a rectangular parallelepiped thermoelectric conversion module member with the diffusion prevention layer at the bottom. This sample was placed in an oven heated to 500° C., after 12 hours had passed, the sample was taken out, the thermoelectric conversion module member was removed from the ceramic plate, and the resistivity (12 h) of the thermoelectric conversion module member was measured by the same method as described above. Here, it can be evaluated that the smaller the ratio between the initial resistivity $\rho$ (0) and the resistivity $\rho$ (12 h), the higher the heat resistance of the thermoelectric conversion module member. The results obtained are shown in Table 1.

As In, a reagent of 99.999% purity manufactured by Kojundo Chemical Co., Ltd. (model number: INE13GB) was used, and as Ga, a reagent of 99.9999% purity manufactured by Kojundo Chemical Co., Ltd. (model number: GAE14PB) was used. A uniform In—Ga solder was obtained by weighing In and Ga so that the weight ratio thereof was 25:75 and stirring while heating with a hot plate.

TABLE 1

| | Diffusion prevention layer | Thermoelectric conversion layer | Diffusion prevention layer | Presence or absence of Peeling | Resistivity ratio $\rho$ (12 h)/ $\rho$ (0) |
|---|---|---|---|---|---|
| Example 1 | Material 2-3 | Material 1-1 | Material 2-3 | absent | 2.1 |
| Example 2 | Material 2-4 | Material 1-1 | Material 2-4 | absent | 1.4 |
| Example 3 | Material 2-6 | Material 1-2 | Material 2-6 | absent | 1.6 |
| Comparative Example 1 | Material 2-1 | Material 1-1 | Material 2-1 | present | — |
| Comparative example 2 | Material 2-2 | Material 1-1 | Material 2-2 | present | — |
| Comparative Example 3 | Material 2-5 | Material 1-1 | Material 2-5 | present | — |
| Comparative Example 4 | — | Material 1-1 | — | absent | 25.7 |

INDUSTRIAL APPLICABILITY

The thermoelectric conversion module member of the present invention can be used as a member of thermoelectric conversion power generation devices for exhaust heat power generation for engines of moving bodies such as automobiles, ships, trucks and buses, and as a member of thermoelectric conversion power generation devices for exhaust heat power generation of manufacturing plants for steel, non-ferrous metals, castings, chemical products, etc. and power plants and incinerators. Furthermore, the thermoelectric conversion module member of the present invention can be applied to various fields such as power generation from naturally occurring heat sources such as geothermal heat and solar heat, power generation from combustion heat of fuels, etc.

EXPLANATION OF SYMBOLS

1: thermoelectric conversion module member (a)
1-a: p-type thermoelectric conversion module member
1-b: n-type thermoelectric conversion module member
2, 2-a, 2-b: diffusion prevention layer
3: thermoelectric conversion layer
3-a: p-type thermoelectric conversion layer
3-b: n-type thermoelectric conversion layer
4-a: higher temperature side electrode
4-b, 4-b': lower temperature side electrode
5-b, 5-c: thermoelectric conversion module
6: external load
7, 8: wiring

The invention claimed is:
1. A thermoelectric conversion module member comprising a thermoelectric conversion layer and a diffusion prevention layer in direct contact with said thermoelectric conversion layer, wherein
said thermoelectric conversion layer is a layer containing a thermoelectric conversion material having a silicon element or a tellurium element,
said diffusion prevention layer is a layer containing a metal and the same thermoelectric conversion material as the thermoelectric conversion material contained in said thermoelectric conversion layer, and
the amount of said thermoelectric conversion material in said diffusion prevention layer is 10 to 50 parts by weight with respect to 100 parts by weight of said metal,
wherein the diffusion prevention layer has a uniform composition comprising the metal and the thermoelectric conversion material, and
wherein the metal excludes Fe.

2. The thermoelectric conversion module member according to claim 1, wherein said thermoelectric conversion material is at least one material selected from the group consisting of a material whose main phase is $Bi_2Te_{3-x}Se_x$ ($0<x<3$) having a crystal structure belonging to the space group R-3m, a material whose main phase is $Bi_{2-y}Sb_yTe_3$ ($0\leq y\leq 2$) having a crystal structure belonging to the space group R-3m, a material whose main phase is GeTe having a crystal structure belonging to the space group R3m, a material whose main phase is $GeBi_2Te_4$ having a crystal structure belonging to the space group R-3m, a material whose main phase is $GeBi_4Te_7$ having a crystal structure belonging to the space group P-3m1, a material whose main phase is SnTe having a crystal structure belonging to the space group Fm-3m, a material whose main phase is PbTe having a crystal structure belonging to the space group Fm-3m, a material whose main phase is $Mg_2Si_{1-z}Sn_z$ ($0\leq z<1$) having a $CaF_2$ type crystal structure, a material whose main phase is $FeSi_2$ having a crystal structure belonging to the space group Cmca, a material whose main phase is $MnSi_\gamma$ ($1.7\leq\gamma\leq 1.8$) having a chimney-ladder type crystal structure, and a material whose main phase is CoSi having a B20 type crystal structure, at 25° C.

3. A thermoelectric conversion module comprising a pair of electrodes and the thermoelectric conversion module member according to claim 1 provided between said pair of electrodes.

4. A method for producing the thermoelectric conversion module member of claim 1, comprising
a first step of disposing one of the following material (1) and the following material (2) or a sintered body thereof in a molding die, to form a first layer;
a second step of disposing the other of said material (1) and said material (2) or a sintered body thereof in said molding die so as to be in contact with the first layer formed in said first layer, to form a second layer thereby obtaining a stacking layer structure, and
a sintering step of sintering the stacking layer structure obtained in the second step, to obtain the thermoelectric conversion module member:
Material (1): a thermoelectric conversion material containing a silicon element or a tellurium element
Material (2): a composition containing a metal and the same thermoelectric conversion material as said material (1) at a proportion of 10 to 50 parts by weight of said thermoelectric conversion material with respect to 100 parts by weight of said metal.

5. The production method according to claim 4, wherein said second step further includes disposing the same material as said first layer or a sintered body thereof among said material (1) and said material (2) on the opposite side of said first layer so as to be in contact with said second layer, to form a third layer thereby obtaining a stacking layer structure.

6. The thermoelectric conversion module member according to claim 1, wherein the thermoelectric conversion material comprises the silicon element.

7. The thermoelectric conversion module member according to claim 1, wherein the thermoelectric conversion material comprises the tellurium element.

8. The thermoelectric conversion module member according to claim 1, wherein said thermoelectric conversion material comprises the material whose main phase is $Bi_2Te_{3-x}Se_x$ ($0<x<3$) having a crystal structure belonging to the space group R-3m.

9. The thermoelectric conversion module member according to claim 8, wherein in said thermoelectric conversion material, a content of the elements other than Bi, Te and Se is 10% by mol or less.

10. The thermoelectric conversion module member according to claim 1, wherein said thermoelectric conversion material comprises the material whose main phase is $Bi_{2-y}Sb_yTe_3$ ($0 \leq y \leq 2$) having a crystal structure belonging to the space group R-3m.

11. The thermoelectric conversion module member according to claim 10, wherein in said thermoelectric conversion material, a content of the elements other than Bi, Sb, and Te is 10% by mol or less.

12. The thermoelectric conversion module member according to claim 1, wherein said thermoelectric conversion material comprises a material whose main phase is GeTe having a crystal structure belonging to the space group R3m.

13. The thermoelectric conversion module member according to claim 1, wherein said thermoelectric conversion material comprises a material whose main phase is $GeBi_2Te_4$ having a crystal structure belonging to the space group R-3m.

14. The thermoelectric conversion module member according to claim 1, wherein said thermoelectric conversion material comprises a material whose main phase is $GeBi_4Te_7$ having a crystal structure belonging to the space group P-3m1.

15. The thermoelectric conversion module member according to claim 1, wherein said thermoelectric conversion material comprises a material whose main phase is SnTe having a crystal structure belonging to the space group Fm-3m.

16. The thermoelectric conversion module member according to claim 1, wherein said thermoelectric conversion material comprises a material whose main phase is $Mg_2Si_{1-z}Sn_z$ ($0 \leq z < 1$) having a $CaF_2$ type crystal structure.

17. The thermoelectric conversion module member according to claim 1, wherein said thermoelectric conversion material comprises a material whose main phase is $FeSi_2$ having a crystal structure belonging to the space group Cmca.

18. The thermoelectric conversion module member according to claim 1, wherein said thermoelectric conversion material comprises a material whose main phase is $MnSi_\gamma$ ($1.7 \leq \gamma \leq 1.8$) having a chimney-ladder type crystal structure.

19. A thermoelectric conversion module member comprising a thermoelectric conversion layer, a diffusion prevention layer in direct contact with said thermoelectric conversion layer, a higher temperature side electrode, and a lower temperature side electrode having a temperature lower than the higher temperature side electrode, wherein
said thermoelectric conversion layer is a layer containing a thermoelectric conversion material having a silicon element or a tellurium element,
said diffusion prevention layer is a layer placed between said thermoelectric conversion layer and the higher temperature side electrode and containing a metal and the same thermoelectric conversion material as the thermoelectric conversion material contained in said thermoelectric conversion layer, and
the amount of said thermoelectric conversion material in said diffusion prevention layer is 10 to 50 parts by weight with respect to 100 parts by weight of said metal, and
wherein the diffusion prevention layer has a uniform composition comprising the metal and the thermoelectric conversion material.

20. A thermoelectric conversion module member comprising a thermoelectric conversion layer and a diffusion prevention layer in direct contact with said thermoelectric conversion layer, wherein
said thermoelectric conversion layer is a layer containing a thermoelectric conversion material having a silicon element or a tellurium element,
said diffusion prevention layer is a layer containing a metal and the same thermoelectric conversion material as the thermoelectric conversion material contained in said thermoelectric conversion layer, and
the amount of said thermoelectric conversion material in said diffusion prevention layer is 10 to 50 parts by weight with respect to 100 parts by weight of said metal,
wherein the diffusion prevention layer has a uniform composition comprising the metal and the thermoelectric conversion material, and
wherein the thermoelectric conversion module member has only one diffusion prevention layer.

* * * * *